US009059250B2

(12) United States Patent
Choi et al.

(10) Patent No.: US 9,059,250 B2
(45) Date of Patent: Jun. 16, 2015

(54) LATERAL-DIMENSION-REDUCING METALLIC HARD MASK ETCH

(75) Inventors: Samuel S. Choi, Beacon, NY (US); Wai-kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 419 days.

(21) Appl. No.: 13/398,875

(22) Filed: Feb. 17, 2012

(65) Prior Publication Data

US 2013/0214391 A1  Aug. 22, 2013

(51) Int. Cl.
| H01L 21/28 | (2006.01) |
| H01L 21/768 | (2006.01) |
| H01L 21/033 | (2006.01) |
| H01L 21/311 | (2006.01) |
| H01L 21/3213 | (2006.01) |

(52) U.S. Cl.
CPC ...... *H01L 21/76816* (2013.01); *H01L 21/0338* (2013.01); *H01L 21/31144* (2013.01); *H01L 21/32136* (2013.01); *H01L 21/32139* (2013.01)

(58) Field of Classification Search
None
See application file for complete search history.

(56) References Cited

U.S. PATENT DOCUMENTS

| 4,144,119 A | 3/1979 | Dutkewych et al. |
| 4,675,073 A | 6/1987 | Douglas |
| 5,851,302 A | 12/1998 | Solis |
| 5,925,577 A | 7/1999 | Solis |
| 5,939,748 A | 8/1999 | Takaishi |
| 5,968,711 A * | 10/1999 | Lee et al. ............ 430/313 |
| 5,982,035 A | 11/1999 | Tran et al. |
| 6,057,081 A * | 5/2000 | Yunogami et al. ...... 430/313 |
| 6,100,183 A * | 8/2000 | Lu et al. ............ 438/637 |
| 6,232,223 B1 | 5/2001 | Tran et al. |
| 6,261,934 B1 | 7/2001 | Kraft et al. |
| 6,387,798 B1 * | 5/2002 | Loke et al. ............ 438/623 |
| 6,451,673 B1 | 9/2002 | Okada et al. |
| 6,531,404 B1 | 3/2003 | Nallan et al. |
| 7,157,375 B2 | 1/2007 | Campbell et al. |
| 7,276,450 B2 | 10/2007 | Mezzapelle |
| 7,354,867 B2 | 4/2008 | Allen et al. |
| 7,553,772 B1 | 6/2009 | Gu et al. |
| 7,638,430 B2 | 12/2009 | Kim |
| 7,863,124 B2 | 1/2011 | Chudzik et al. |
| 2010/0295147 A1 | 11/2010 | Wu et al. |

\* cited by examiner

*Primary Examiner* — Matthew W Such
*Assistant Examiner* — Abul Kalam
(74) *Attorney, Agent, or Firm* — Scully, Scott, Murphy & Presser, P.C.; Catherine Ivers

(57) ABSTRACT

A combination of gases including at least a fluorocarbon gas, oxygen, and an inert sputter gas is employed to etch at least one opening into an organic photoresist. The amount of oxygen is controlled to a level that limits conversion of a metallic nitride material in an underlying hard mask layer to a metal oxide, and causes organic polymers generated from the organic photoresist to cover peripheral regions of each opening formed in the organic photoresist. The hard mask layer is etched with a taper by the oxygen-limited fluorine-based etch chemistry provided by the combination of gases. The taper angle can be controlled such that a shrink ratio of the lateral dimension by the etch can exceed 2.0.

20 Claims, 15 Drawing Sheets

LATERAL-DIMENSION-REDUCING METALLIC HARD MASK ETCH

BACKGROUND

The present disclosure relates to semiconductor processing methods, and particularly to methods for shrinking lateral dimensions employing an etch that transfers lithographic dimensions in a lithographic pattern in a photoresist layer into sublithographic dimensions in a metallic hard mask, and structures for effecting the same.

As semiconductor devices continue to shrink in dimension, the limits of capabilities of current deep ultraviolet (DUV) lithographic tools are reached around a pitch dimension of about 65 nm. While extreme ultra-violet (EUV) lithography tools under development target to print lithographic patterns having a pitch less than 65 nm, such EUV lithographic tools are still under development, and are not commercially available.

Various unconventional lithographic technologies known in the art include a pitch split sidewall image transfer (SIT) process and a double patterning process. However, such lithographic technologies require multiple lithographic exposures, and thereby increase processing cost and processing time.

BRIEF SUMMARY

A combination of gases including at least a fluorocarbon gas, oxygen, and an inert sputter gas is employed to etch at least one opening into an organic photoresist. The amount of oxygen is controlled to a level that limits conversion of a metallic nitride material in an underlying hard mask layer to a metal oxide, and causes organic polymers generated from the organic photoresist to cover peripheral regions of each opening formed in the organic photoresist. The hard mask layer is etched with a taper by the oxygen-limited fluorine-based etch chemistry provided by the combination of gases. The taper angle can be controlled such that a shrink ratio of the lateral dimension by the etch can exceed 2.0.

According to an aspect of the present disclosure, a method of forming a patterned structure is provided, which includes: forming a stack including, from bottom to top, at least one underlying material layer, a metallic hard mask layer, and a photoresist layer; patterning the photoresist layer with a pattern including at least one opening therein; and transferring the pattern into the metallic hard mask layer in an etch process employing a combination of gases, the combination of gases including at least one fluorocarbon gas, oxygen, and at least one inert sputter gas, wherein a top surface of the metallic hard mask layer underneath the at least one opening is etched with a taper, and an angle of the taper relative a horizontal surface is less than 45 degrees.

According to another aspect of the present disclosure, a structure is provided, which includes: at least one underlying material layer located on a substrate; a metallic hard mask layer located on a topmost surface of the at least one underlying material layer; and a photoresist layer located over the metallic hard mask layer and having a pattern including at least one opening therein, wherein a top surface of the metallic hard mask layer underneath the at least one opening is tapered, and an angle between the tapered top surface of the metallic hard mask layer relative a horizontal surface is less than 45 degrees.

DETAILED DESCRIPTION

Figure 1:
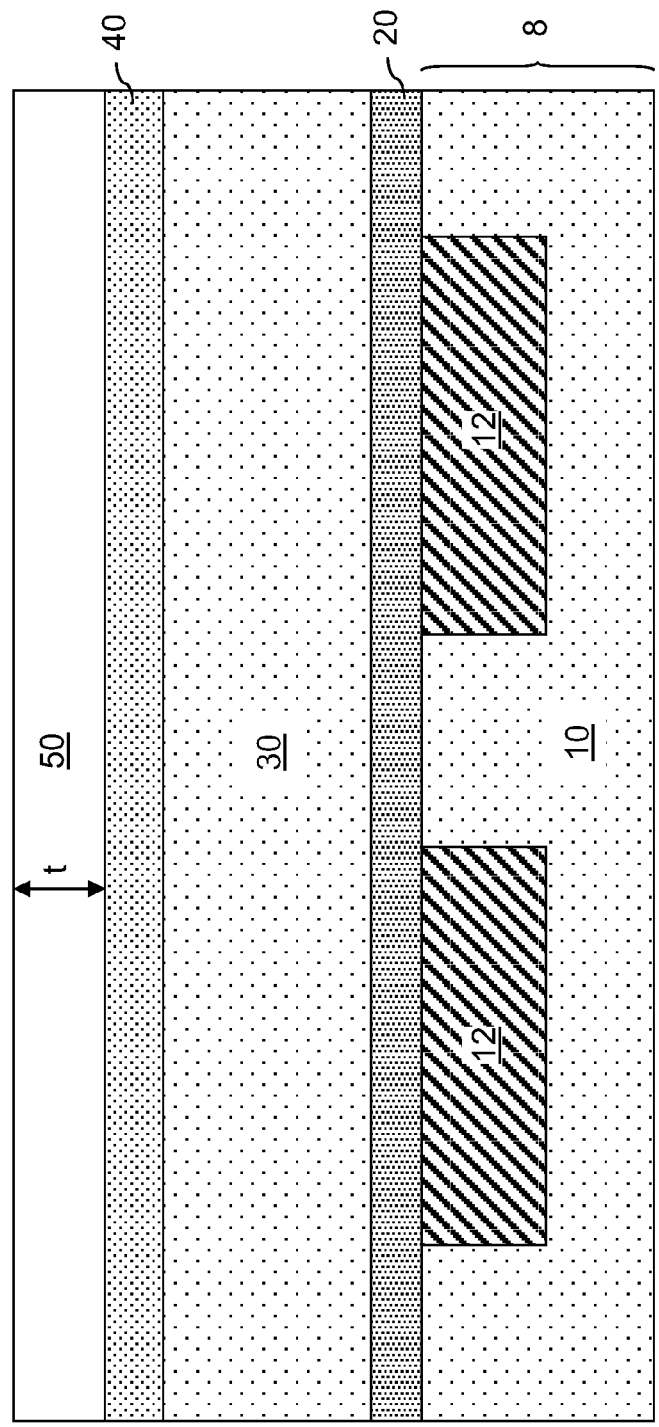
FIG. 1 is a vertical cross-sectional view of a first exemplary structure after formation of a dielectric material layer, a dielectric cap layer, and a metallic hard mask layer according to a first embodiment of the present disclosure.

As stated above, the present disclosure relates to methods for shrinking lateral dimensions employing an etch that transfers lithographic dimensions in a lithographic pattern in a photoresist layer into sublithographic dimensions in a metallic hard mask, and structures for effecting the same, which are now described in detail with accompanying figures. Throughout the drawings, the same reference numerals or letters are used to designate like or equivalent elements. The drawings are not necessarily drawn to scale.

Referring to FIG. 1, a first exemplary structure according to a first embodiment of the present disclosure includes a substrate 8 and a stack of material layers formed thereupon. The substrate 8 includes a substrate layer 10 and can include at least one embedded structure 12. The substrate layer 10 can be a single layer or a stack of multiple layers having different materials. For example, the substrate layer 10 include a semiconductor material layer including at least one semiconductor device such as field effect transistors and/or interconnect-level dielectric material layers. In one embodiment, the substrate layer 10 can be a semiconductor material layer such as a silicon layer, and the at least one embedded structure 12 can be at least one semiconductor device such as at least one field effect transistor. Alternatively, the substrate layer 10 can include a dielectric material layer and the at least one embedded structure 12 can be at least one metal interconnect structure such as metal lines and metal vias that provide electrically conductive paths to electronic component (not shown) located underneath the at least one embedded structure 12 and within the substrate layer 10.

The stack of material layers formed on a top surface of the substrate 8 can include, for example, an optional underlying dielectric cap layer 20, a dielectric material layer 30, an underlying dielectric hard mask layer 40, and a metallic hard mask layer 50.

The optional underlying dielectric cap layer 20, if present, includes a dielectric material. The optional underlying dielectric cap layer 20 can protect underlying structures from impurities that may diffuse down from upper levels, and can function as a diffusion barrier layer that prevents vertical diffusion of metallic impurities, moisture, or other gaseous impurities. The optional underlying dielectric cap layer 20 can include, for example, silicon nitride, silicon oxynitride, a nitrogen-doped organosilicate glass, or a combination thereof. The optional underlying dielectric cap layer 20 can be formed, for example, by chemical vapor deposition (CVD) or atomic layer deposition (ALD). The thickness of the optional underlying dielectric cap layer 20 can be from 2 nm to 30 nm, although lesser and greater thicknesses can also be employed.

The dielectric material layer 30 includes a dielectric material that can be employed for forming metal interconnect structures therein. For example, the dielectric material layer 30 can include undoped silicon oxide, doped silicon oxide, silicon nitride, silicon oxynitride, non-porous organosilicate glass (OSG), and porous OSG, or a combination thereof. The dielectric material layer 30 can be formed, for example, by chemical vapor deposition (CVD) or spin-coating. The dielectric material layer 30 can have a thickness from 30 nm to 1,000 nm, although lesser and greater thicknesses can also be employed.

The underlying dielectric hard mask layer 40 is optional. In one embodiment, the underlying dielectric hard mask layer 40 can be employed to provide a greater mechanical strength during a subsequent planarization process. Alternately or additionally, the underlying dielectric hard mask layer 40 can be employed as an etch mask for etching the dielectric material layer. Alternately or additionally, the underlying dielectric hard mask layer 40 can be employed to protect the dielectric material layer 30 and structures to be embedded therein from impurities that may diffuse down from upper levels, and can function as a diffusion barrier layer that prevents vertical diffusion of metallic impurities, moisture, or other gaseous impurities. The underlying dielectric hard mask layer 40 can include, for example, silicon nitride, silicon oxynitride, a nitrogen-doped organosilicate glass, or a combination thereof. The underlying dielectric hard mask layer 40 can be formed, for example, by chemical vapor deposition (CVD) or atomic layer deposition (ALD). The thickness of the underlying dielectric hard mask layer 40 can be from 2 nm to 30 nm, although lesser and greater thicknesses can also be employed.

The metallic hard mask layer 50 includes a metallic material. In one embodiment, the metallic hard mask layer 50 can include a metal nitride material such as TiN, TaN, WN, a combination thereof, and a stack thereof. In one embodiment, the metallic hard mask layer 50 can consist essentially of TiN.

The metallic hard mask layer 50 can be formed, for example, by chemical vapor deposition (CVD), physical vapor deposition (PVD), atomic layer deposition (ALD), or a combination thereof. The thickness of the metallic hard mask layer 50 can be, for example, from 3 nm to 60 nm, although lesser and greater thicknesses can also be employed. In one embodiment, the thickness of the metallic hard mask layer 50 can be from 6 nm to 30 nm.

Figure 2:
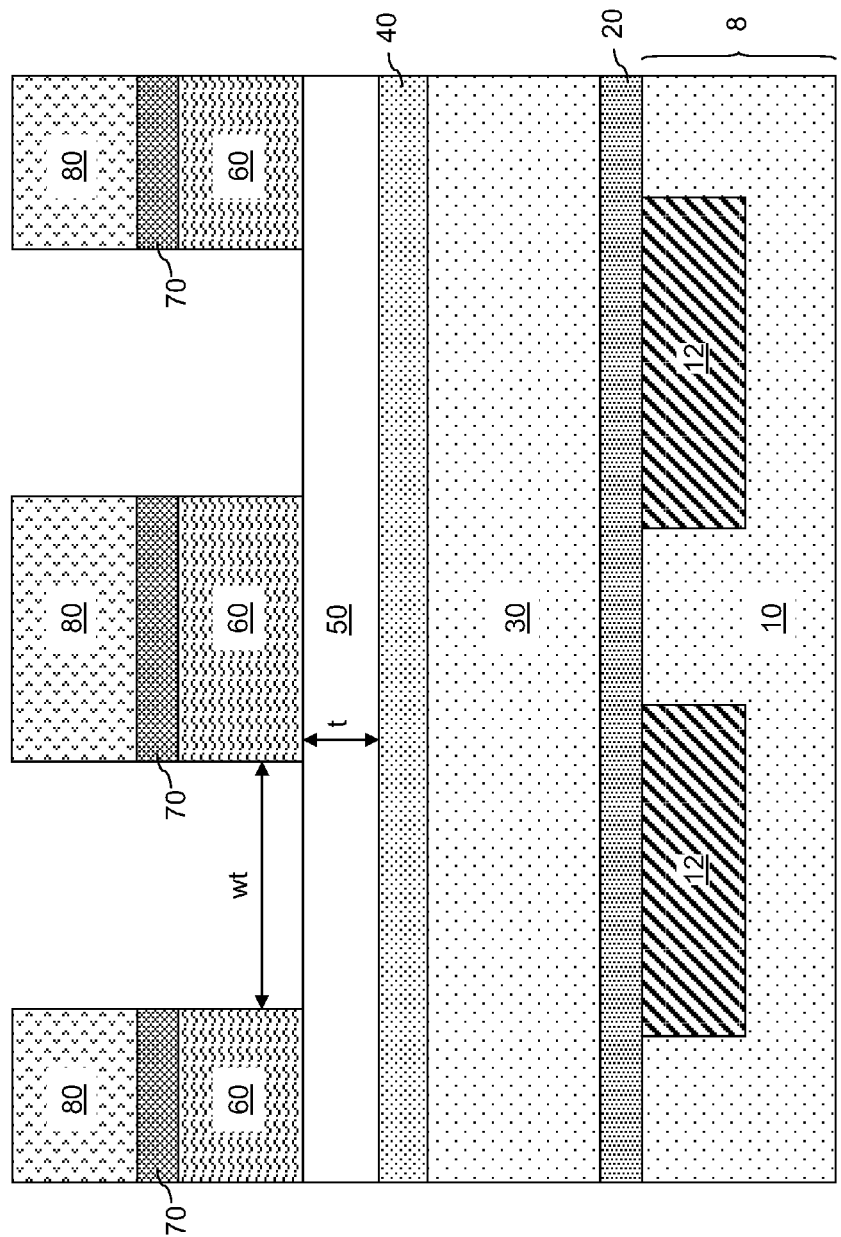
FIG. 2 is a vertical cross-sectional view of the first exemplary structure after application and patterning of an organic planarizing layer (OPL), an antireflective coating (ARC) layer, and a photoresist layer according to the first embodiment of the present disclosure.
Figure 3:
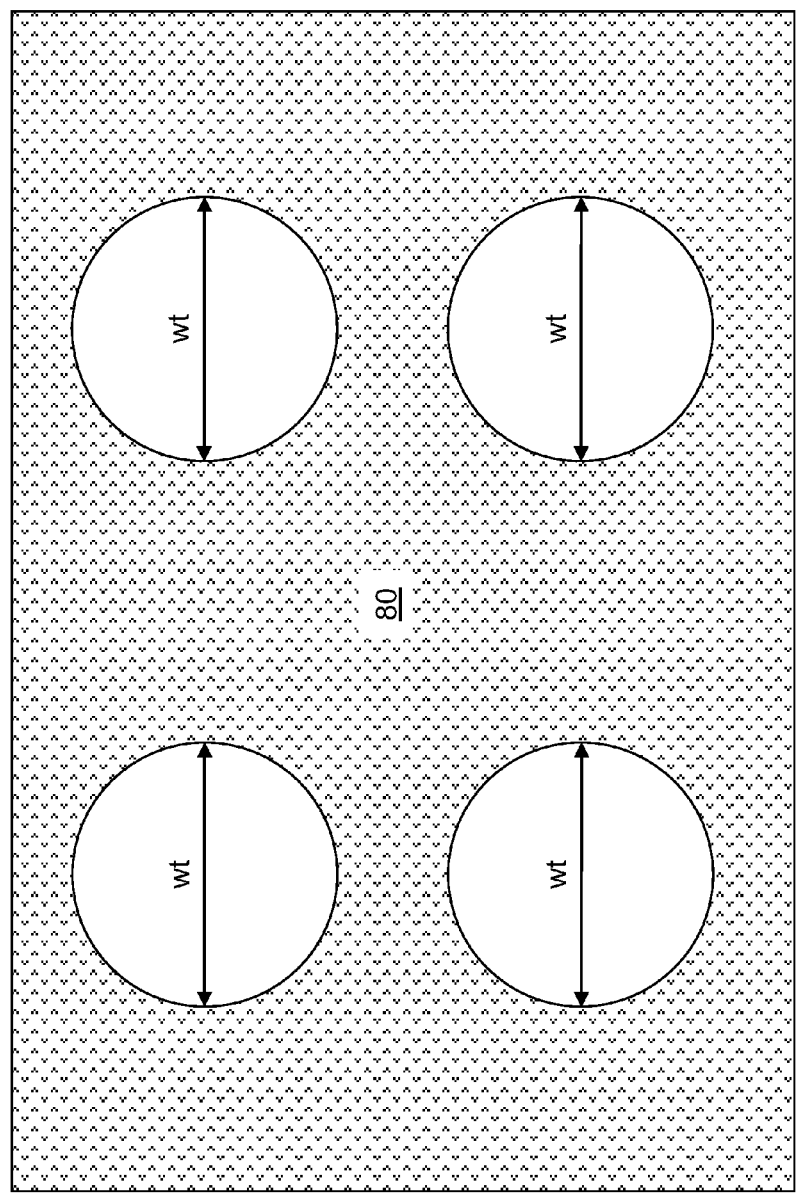
FIG. 3 is a top-down view of the first exemplary structure of FIG. 2.

Referring to FIGS. 2 and 3, a stack of an organic planarizing layer (OPL) 60, an antireflective coating (ARC) layer 70, and a photoresist layer 80 can be formed, for example, by spin-coating.

The OPL 60 includes a self-planarizing organic planarization material, which can be a polymer layer with sufficiently low viscosity so that the top surface of the OPL 60 is a planar horizontal surface. The self-planarizing organic planarization material can be any material employed for an organic planarization layer in trilayer lithography methods known in the art. The thickness of the OPL 60 can be from 10 nm to 200 nm, although lesser and greater thicknesses can also be employed.

The ARC layer 70 is an optional layer, and can be formed, for example, by spin coating. The ARC layer 70 can include any anti-reflective material known in the art, and can include silicon and/or an organic material. The thickness of the ARC layer 70 can be from 10 nm to 150 nm, although lesser and greater thicknesses can also be employed.

The photoresist layer 80 is applied directly on the ARC layer 70 or directly on the OPL 60, for example, by spin coating. The thickness of the photoresist layer 80 can be from 200 nm to 600 nm, although lesser and greater thicknesses can also be employed. The photoresist layer 80 can be a layer of a photoresist sensitive to deep-ultraviolet (DUV) radiation, extreme ultraviolet (EUV), or mid-ultraviolet (MUV) radiation as known in the art, or can be an e-beam resist that is sensitive to radiation of energetic electrons.

The photoresist layer 80 is patterned with a lithographic pattern by lithographic exposure and development. The lithographic pattern can be a via pattern including shapes for a plurality of via holes as illustrated in FIGS. 2 and 3, or can be a line pattern including shapes for at least one line trench to be subsequently formed in the dielectric material layer 30. The shapes for the plurality of via holes can include circles and/or ellipses. For example, the plurality of via holes can have a circular shape having a diameter wt, which is herein referred to as a "top diameter."

In one embodiment, the plurality of via holes can include via holes that have minimum printable sizes for any given shape, e.g., a minimum-printable size circle or a minimum printable size ellipse for any given eccentricity. In one embodiment, the plurality of via holes can be circular via holes having a top diameter, wt, of a minimum-printable circular hole, which is referred to as a "critical dimension" for a circular hole. As of 2012, the critical dimension for a circular hole by deep ultraviolet lithography is about 65 nm.

The pattern in the photoresist layer 80 is transferred through the ARC layer 70 and the OPL 60 by a pattern transfer etch, which can be an anisotropic etch. In one embodiment, the pattern transfer etch can be a reactive ion etch that removes the materials of the ARC layer 70 and the OPL 60 employing the photoresist layer 80 as an etch mask.

While the present disclosure is described employing the stack of the OPL 60, the ARC layer 70, and the photoresist layer 80, the stack of the OPL 60, the ARC layer 70, and the photoresist layer 80 can be replaced with one or more layers that include a photosensitive material as known in the art.

Figure 4:
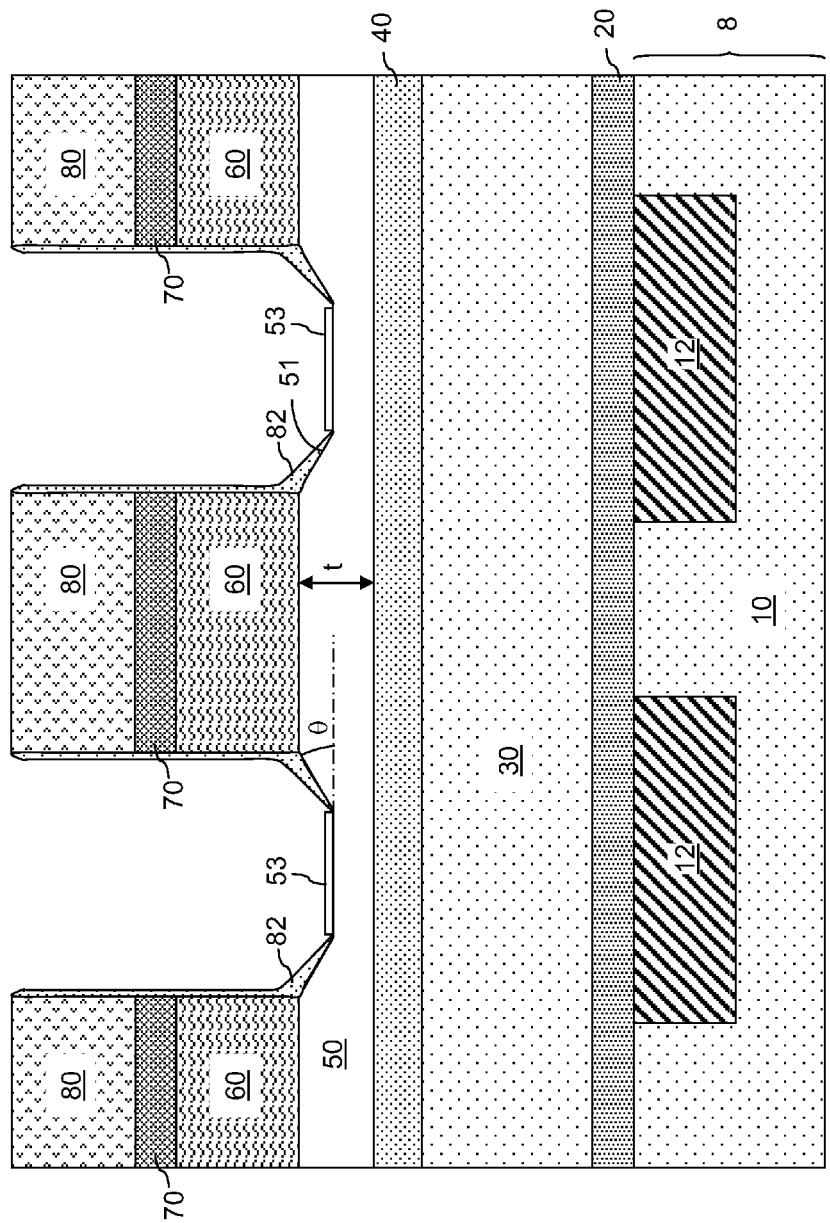
FIG. 4 is a vertical cross-sectional view of the first exemplary structure during an etch of the metallic hard mask layer according to the first embodiment of the present disclosure.

Referring to FIG. 4, the metallic hard mask layer 50 is etched in an etch process that employs the patterned stack of the photoresist layer 80, the ARC layer 60, and the OPL 50 as an etch mask. The etch process employs a combination of gases, which includes at least one fluorocarbon gas, oxygen, and at least one inert sputter gas.

Oxygen functions as an oxidant for the metallic material of the metallic hard mask layer 50. Specifically, metal nitride is converted into a metal oxide material by oxygen prior to removal from the metallic hard mask layer 50 during the etch process. Surface portions of the metallic nitride material of the metallic hard mask layer 50 are exposed to the oxygen gas during the etch process, and are converted into surface metal oxide portions 53 underneath the openings in the patterned stack of the photoresist layer 80, the ARC layer 60, and the OPL 50. The flow of oxygen into the process chamber including the first exemplary structure is limited so that the conversion of the metallic nitride material into surface metal oxide portions 53 is the rate-limiting step for etching the metal nitride material of the metallic hard mask layer 50. The surface metal oxide portions 53 include a volatile metal oxide material. For example, if the metallic hard mask layer 50 includes TiN, the surface metal oxide portions 53 can include $TiO_x$, wherein x is a number between 0.25 and 3.

The at least one fluorocarbon gas does not etch the metallic nitride material directly, but etches the metal oxide in the surface metal oxide portions 53. The at least one fluorocarbon gas can be a single fluorocarbon gas, or can be a plurality of fluorocarbon gases. Each of the at least one fluorocarbon gas can consist of fluorine and carbon, or can include hydrogen, i.e., can be a hydrofluorocarbon gas. Exemplary gases that can be employed for the at least one fluorocarbon gas include, but are not limited to, $CF_4$, $CH_2F_2$, $CHF_3$, $C_2F_6$, $C_2HF_5$, $C_2H_2F_4$, $C_2H_3F_3$, $C_2H_4F_2$, $C_2F_4$, $C_2HF_3$, $C_2H_2F_2$, $C_2F_2$, $C_3F_6$, and $C_4F_8$.

The at least one inert sputter gas is one or more gases that are employed to provide ion sputtering of the physically exposed surfaces of the metallic hard mask layer 50. Specifically, the surface metal oxide portions 53 that are present on physically exposed surfaces of the metallic hard mask layer 50 are sputtered with the ions of the inert sputter gas. The at least one inert sputter gas can include one or more of $N_2$, He, Ne, Ar, Xe, and Kr.

The etch process is a plasma etch process in which reactive ions of the combination of gases are generated. Thus, plasmas of each of the at least one fluorocarbon gas, oxygen, and at least one inert sputter gas is generated within the process chamber, and reacts with the material of the metallic hard mask layer 50. Further, the plasma of the various gases interacts with organic materials of the photoresist layer 80 and organic materials of the OPL 60. If the ARC layer 70 includes an organic material, the plasma interacts with the organic material of the ARC layer 70. An organic polymer 82 is continuously generated by the plasma of the etch process from the photoresist layer 80. Thus, the organic polymer 82 continuously flows down sidewalls of the photoresist layer 80, the ARC layer 70, and the OPL 60, and covers peripheral regions of top surfaces of the metallic hard mask layer 40 underneath the openings in the stack of the photoresist layer 80, the ARC layer 70, and the OPL 60. Optionally, additional organic polymers from the OPL 60 and/or the ARC layer 70 can be added to the peripheral regions of the top surface of the metallic hard mask layer 40 within each opening.

During lateral movement toward the center of each opening, the organic polymer 82 is removed by ion sputtering and by the chemical reaction with the various ions in the plasma. Thus, more organic polymer is present along the peripheral portion of each opening relative to the center of that opening. Conversion of the metallic nitride material of the metallic hard mask layer 50 into surface metal oxide portions 53 proceeds only in areas that are not covered by the organic polymer 82, and a taper profile is developed on a top surface of the metallic hard mask layer 50 at the bottom of each opening in the stack of the photoresist layer 80, the ARC layer 70, and the OPL 60. Thus, a top surface of the metallic hard mask layer 50 is etched with a taper underneath each opening. The flow rate of oxygen, the flow rate of the at least one fluorocarbon gas, and the sputter removal rate of the organic polymer 82 are controlled such that an angle of the taper $\theta$ relative a horizontal surface is less than 45 degrees.

In one embodiment, the ratio of the flow rate of oxygen to the flow rate of the at least one fluorocarbon gas is not greater than 0.2 during the etch process. For example, the ratio of the flow rate of oxygen to the flow rate of the at least one fluorocarbon gas can be from 0.025 to 0.2 during the etch process.

In one embodiment, the ratio of the flow rate of the at least one inert sputter gas to the flow rate of the at least one fluorocarbon gas is from 0.25 to 10. In one embodiment, the ratio of the flow rate of the at least one inert sputter gas to the flow rate of the at least one fluorocarbon gas can be from 0.50 to 5.

In one embodiment, the taper angle $\theta$ can be from 15 degrees to 40 degrees. In another embodiment, the taper angle $\theta$ can be from 20 degrees to 35 degrees.

The etch chemistry is fluorine-based, and does not employ any chlorine or bromine. Thus, the combination of gases does not include chlorine, bromine, or any compound thereof.

The combination of gases can optionally include hydrogen. If present, the flow rate of hydrogen is not greater than twice the flow rate of the at least one fluorocarbon gas, i.e., not greater than twice the flow rate of the sum of all fluorocarbon gas(es) in the combination of gases. In one embodiment, the flow rate of hydrogen is not greater than the flow rate of the at least one fluorocarbon gas.

In an illustrative example, if a reactive ion etch process chamber large enough to accommodate a 300 mm diameter substrate can be employed to perform the etch process, the flow rate of the at least one fluorocarbon gas can be from 20 sccm to 200 sccm, the flow rate of oxygen can be from 5 sccm to 10 sccm, and the flow rate of argon can be from 50 sccm to 400 sccm. The reactive ion etch process chamber can be maintained, for example, at a pressure from 20 mTorr to 200 mTorr and at a temperature from 20 degrees Celsius to 80 degrees Celsius. Radio frequency (RF) plasma can be employed to generate the plasma of the combination of gases, and the power employed to generate the RF plasma can be from 100 kW to 1,000 kW, although lesser and greater power can also be employed.

The taper profile starts at the center of each opening due to the sidewall polymer coverage and presence of the organic polymer 82 at peripheral portions of the openings. The small taper angle $\theta$ is a result of the limited supply of oxygen during the etch process and the consequent limitation on the rate of oxidation of the metallic nitride material of the metallic hard mask layer 50. The limited oxygen supply has the adverse effect of significantly slowing down the etch rate of the metallic hard mask layer 50. However, the small value for the taper angle θ, i.e., the taper angle θ less than 45 degrees, results in significant narrowing of the lateral dimension(s) in the recessed portions of the metallic hard mask layer 50 underneath the openings in the stack of the photoresist layer 80, the ARC layer 70, and the OPL 60.

The first exemplary structure of FIG. 4 includes at least one underlying material layer (20, 30, 40) located on the substrate 8; a metallic hard mask layer 50 located on a topmost surface of the at least one underlying material layer (20, 30, 40); and a photoresist layer 80 located over the metallic hard mask layer 50 and having a pattern including at least one opening therein. A top surface 51 of the metallic hard mask layer 50 underneath the at least one opening is tapered. An angle, i.e., the taper angle θ, between the tapered top surface 51 of the metallic hard mask layer 50 relative a horizontal surface is less than 45 degrees. The metallic hard mask layer 50 can include a metal nitride. A metal oxide material including the same metallic element as the metal nitride, i.e., a surface metal oxide portion 53, is present at a surface portion of the tapered top surface 51 of the metallic hard mask layer 50. An organic polymer 82 derived from a material of the photoresist layer 80 is present on sidewall surfaces of the photoresist layer 80 and the tapered top surface 51 of the metallic hard mask layer 50.

Figure 5:
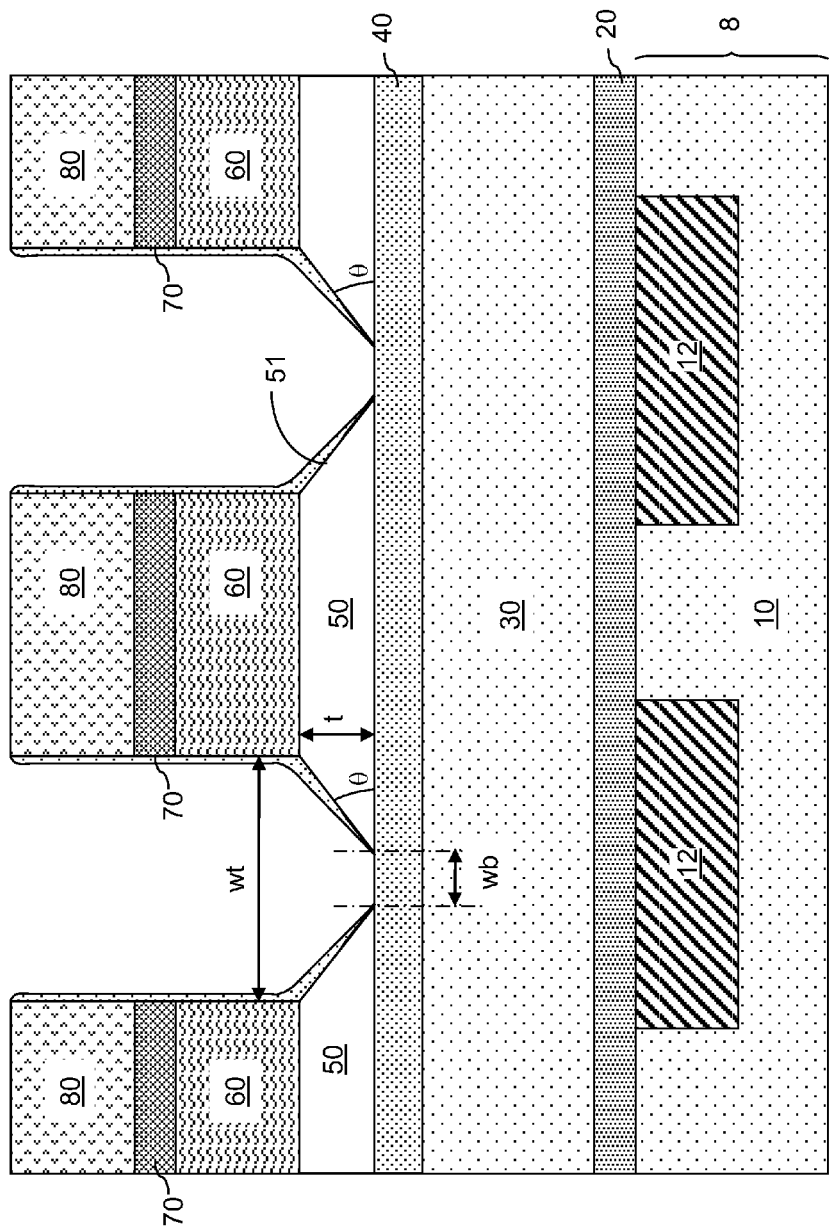
FIG. 5 is a vertical cross-sectional view of the first exemplary structure after the etch of the metallic hard mask layer according to the first embodiment of the present disclosure.

Referring to FIG. 5, the etch process continues until the metallic hard mask layer 50 is etched through. Tapered via holes and/or tapered line trenches are formed within the metallic hard mask layer 50 by the etch process. While this etch process consumes more time than metal etch processes that employ a higher oxygen flow rate and do not limit the oxidation rate of a metal nitride material, the slower conversion rate from a metallic nitride to a metal oxide and a slower removal of the organic polymer 82 provided by the chemistry of the etch process of the present disclosure enables reduction of the taper angle θ below 45 degrees.

If the via holes in the stack of the photoresist layer 80, the ARC layer 70, and the OPL 60 have circular shapes having the top diameter wt, the diameter of circular openings at the bottom surface of the metallic hard mask layer 50 can have a bottom diameter wb, which is smaller than the top diameter wt. Because the taper angle θ can be less than 45 degrees, the bottom diameter wb can be significantly smaller than the top diameter wt. In one embodiment, the top diameter wt can be a lithographic dimension, i.e., a dimension that can be printed by lithographic methods, for deep ultraviolet lithography, and the bottom diameter wb can be a sub-lithographic dimension, i.e., smaller than the minimum dimension (i.e., a "critical dimension") that can be printed by deep ultraviolet lithography.

In general, the thickness of the metallic hard mask layer 50 and the taper angle θ can be selected so that the ratio of a first lateral dimension (e.g., the top diameter wt) of an opening in the metallic hard mask layer 50 as measured at a height of a topmost surface of the metallic hard mask layer 50 to a second lateral dimension (e.g., the bottom diameter wb) of the opening in the metallic hard mask layer 50 as measured at a bottom surface of the metallic hard mask layer 50 and directly underneath a location of measurement of the first lateral dimension can be greater than 2.0. The ratio of the first lateral dimension to the second lateral dimension is herein referred to as a shrink ratio. Thus, the shrink ratio that the etch process of the present disclosure provides can be greater than 2.0. In one embodiment, the shrink ratio can be not less than 3.0. In one embodiment, the shrink ratio can be greater than, equal to, or less than 5.0.

In one embodiment, the first lateral dimension can be substantially the same as a width of an opening in the photoresist layer 80, and the second lateral dimension can be less than ½ of a minimum printable dimension for any opening for deep ultraviolet lithography tools.

Figure 6:
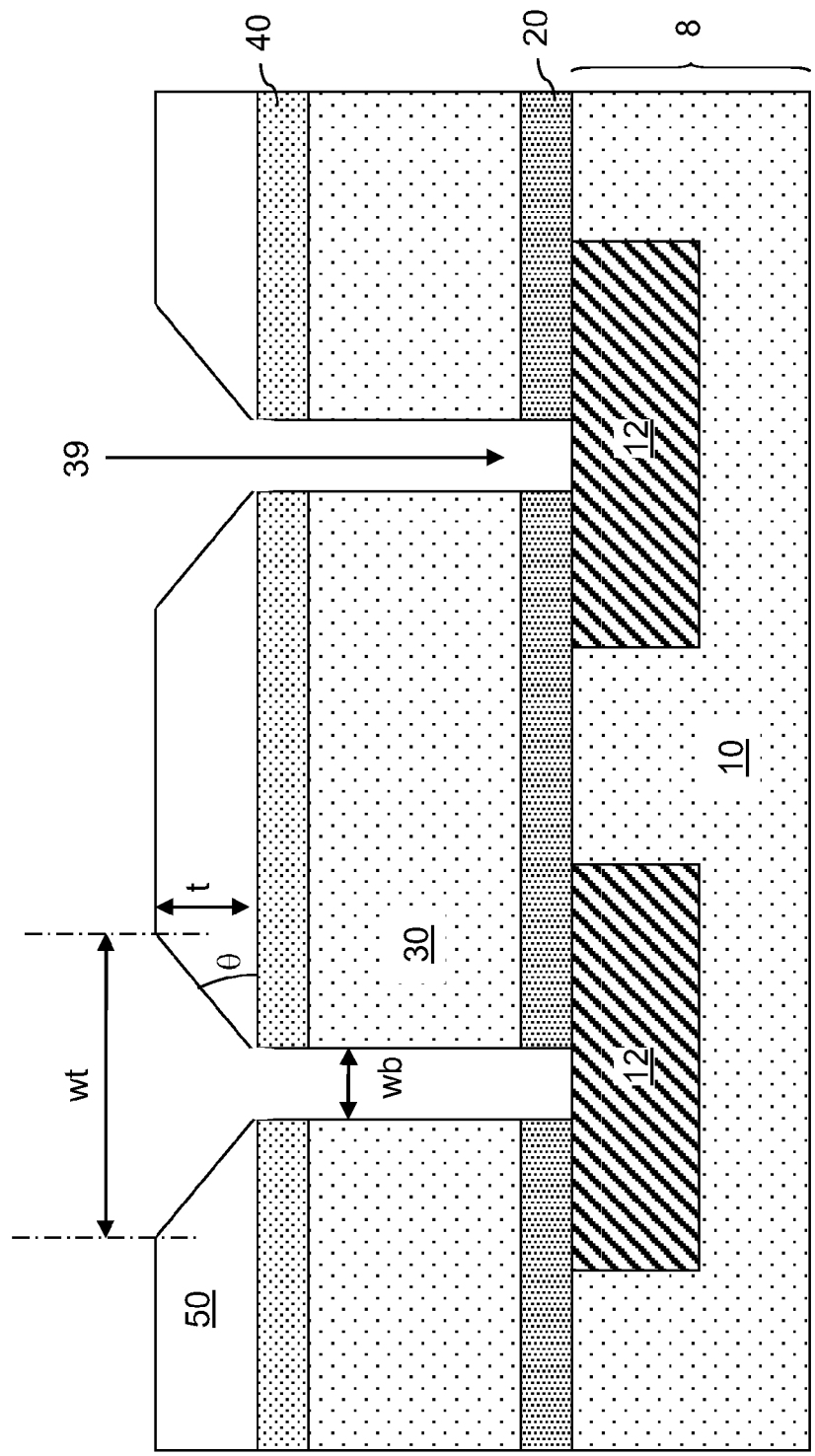
FIG. 6 is a vertical cross-sectional view of the first exemplary structure after transfer of the pattern in the metallic hard mask layer into underlying layers according to the first embodiment of the present disclosure.
Figure 7:
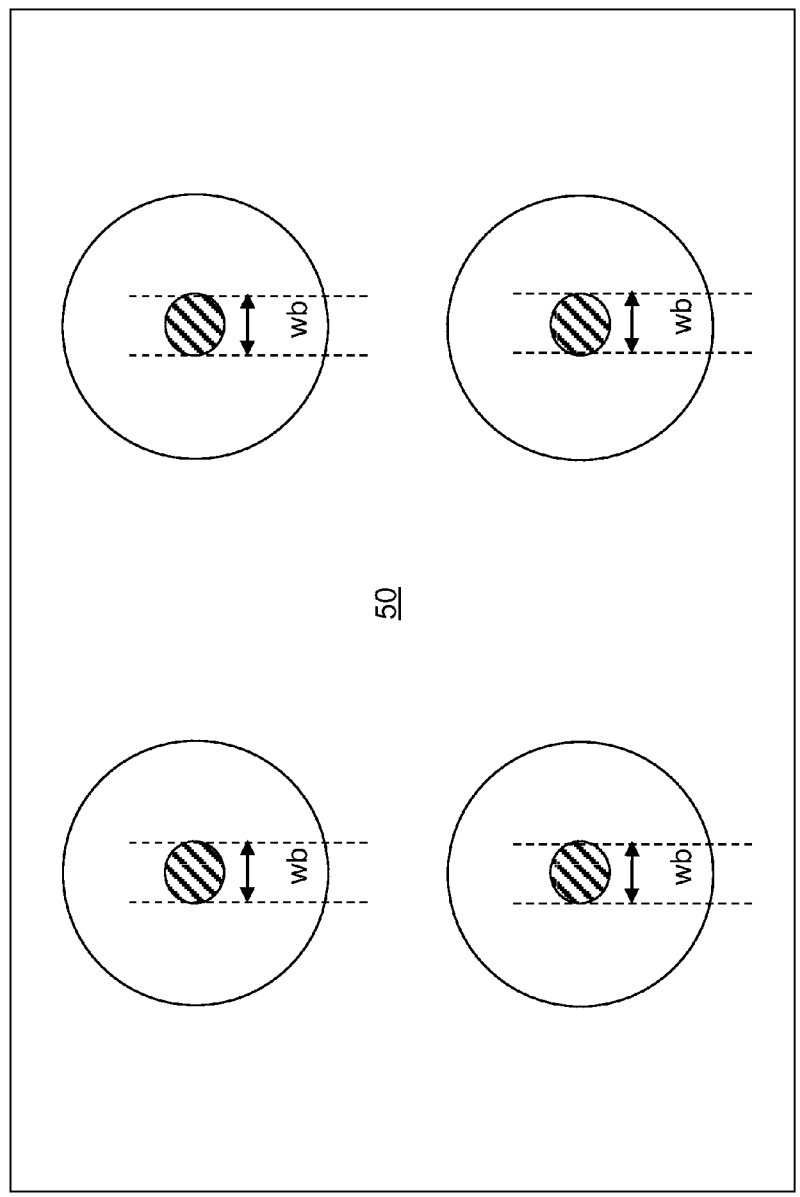
FIG. 7 is a top-down view of the first exemplary structure of FIG. 6.

Referring to FIGS. 6 and 7, the pattern in the metallic hard mask layer 50 is transferred into at least one underlying layer in an etch that employs the metallic hard mask layer 50 as an etch mask. The at least one underlying layer includes the underlying dielectric hard mask layer 40, if present, and can optionally include the dielectric material layer 30, and can optionally include the optional underlying dielectric cap layer 20.

At least one hole 39 is formed in the at least one underlying layer (20, 30, 40). In one embodiment, the at least one hole 39 can extend to the topmost surface of the dielectric material layer 30, i.e., the bottommost surface of the at least one hole 39 can be substantially coplanar with the topmost surface of the dielectric material layer 30.

In another embodiment, the at least one hole 39 can extend to the topmost surface of the optional underlying dielectric cap layer 20, i.e., the bottommost surface of the at least one hole 39 can be substantially coplanar with the topmost surface of the optional underlying dielectric cap layer 20.

In yet another embodiment, the at least one hole 39 can extend to a topmost portion of the substrate 8 or a topmost surface of an embedded structure 12 located in the substrate 8.

In one embodiment, each hole formed in the underlying dielectric hard mask layer 40 can have a horizontal cross-sectional area that is independent of height between the topmost horizontal surface of the underlying dielectric hard mask layer 40 and a bottommost surface of the underlying dielectric hard mask layer 40.

In one embodiment, the at least one hole 39 in the at least one underlying layer (20, 30, 40) can have a horizontal cross-sectional area that is independent of height between the topmost horizontal surface of the at least one underlying layer (20, 30, 40) and a bottommost surface of the at least one underlying layer (20, 30, 40).

The metallic hard mask layer 50 can remain intact after formation of the at least one hole 39 in the at least one underlying layer (20, 30, 40). Alternately, the metallic hard mask layer 50 can be partially or completely eroded during formation of the at least one hole 39. In this case, the pattern at the bottommost surface of the metallic hard mask layer 50 is present in the underlying dielectric hard mask layer 40, and the underlying dielectric hard mask layer 40 can be employed as another etch mask layer that prevents widening of the lateral dimensions of the at least one hole 39 in the dielectric material layer 30 and/or the optional underlying dielectric cap layer 20 if the at least one hole extends below the underlying dielectric hard mask layer 40 during the etch.

Figure 8:
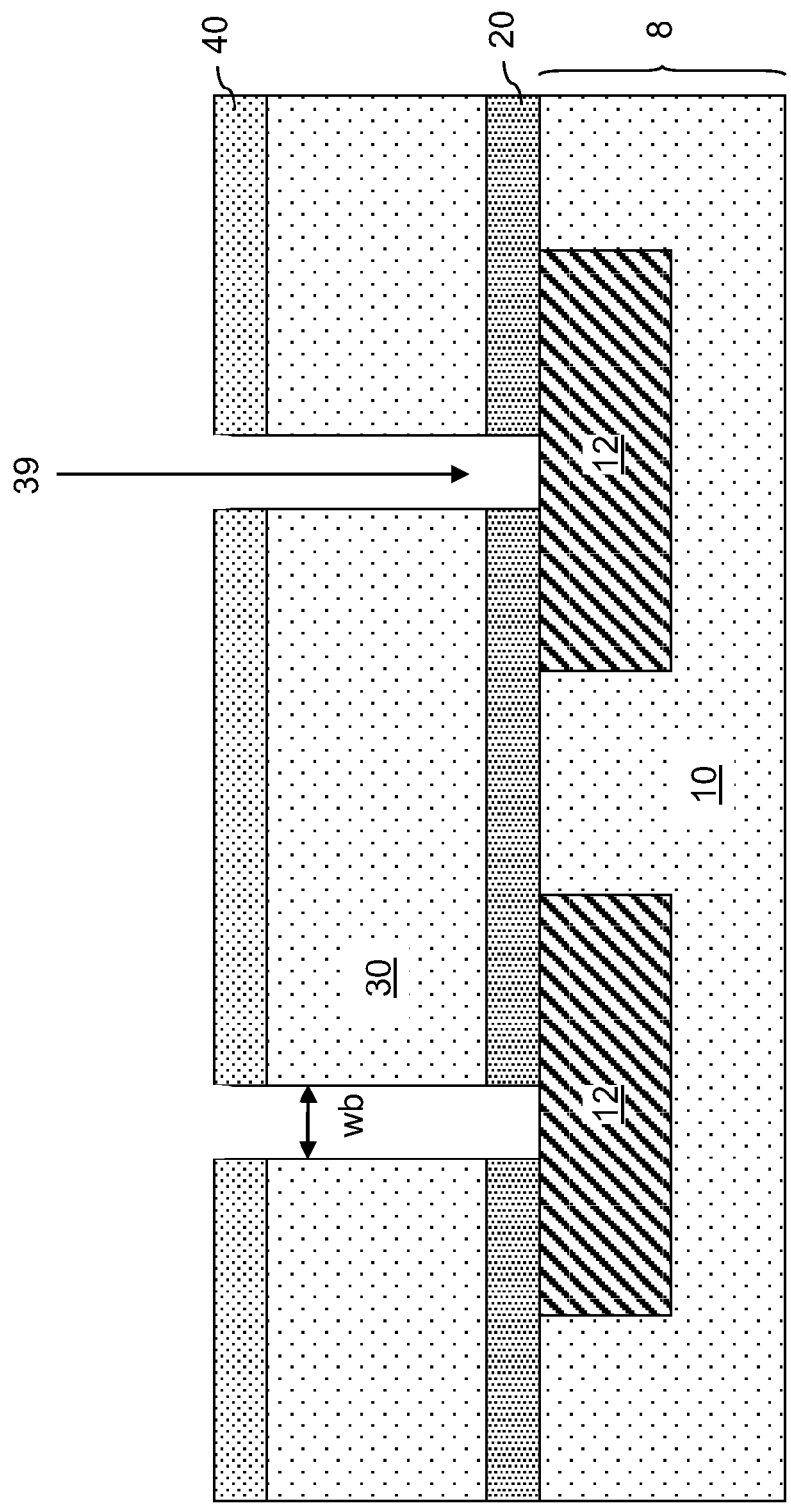
FIG. 8 is a vertical cross-sectional view of a variation of the first exemplary structure after transfer of the pattern in the dielectric cap layer into underlying layers according to the first embodiment of the present disclosure.

If the metallic hard mask layer 50 is completely removed during formation of the at least one hole 39 or if the metallic hard mask is intentionally removed after the bottom surface of the at least one hole 39 reaches a predefined height above the top surface of the substrate 8, e.g., at the top surface of the dielectric material layer 30, the underlying dielectric hard mask layer 40 can be employed during a subsequent etch that extends the at least one hole 39 to the top surface of the substrate 8 employing the underlying dielectric hard mask layer 40 as an etch mask. This configuration is illustrated in FIG. 8.

Thus, the pattern at the bottom surface of the metallic hard mask layer 50 is transferred into the underlying dielectric hard mask layer 40, and at least one dielectric material layer, e.g., the dielectric material layer 30 and optionally into the optional underlying dielectric cap layer 20, employing the underlying dielectric hard mask layer 40 as an etch mask layer.

Figure 9:
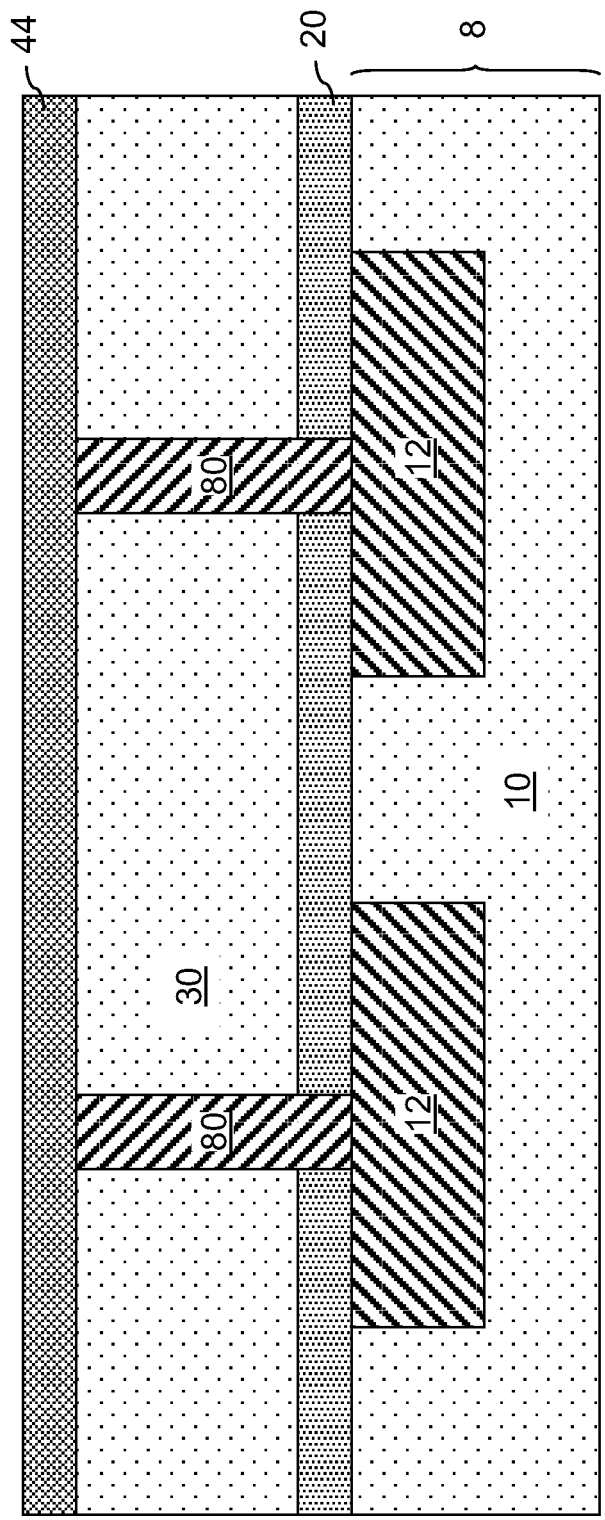
FIG. 9 is a vertical cross-sectional view of the first exemplary structure after formation of contact via structures according to the first embodiment of the present disclosure.

Referring to FIG. 9, at least one contact via structure 80 is formed by filling each of the at least one hole 39 with a conductive material, and subsequently removing excess conductive material from above the top surface of the underlying dielectric hard mask layer 40 by planarization. For example, chemical mechanical planarization (CMP) and/or a recess etch can be employed for planarization. If any portion of the metallic hard mask layer 50 is present after deposition of the conductive material, the remaining portion of the metallic hard mask layer 50 is removed during the planarization. The underlying dielectric hard mask layer 40 may, or may not, be removed during the planarization. A dielectric cap layer 44 can be deposited over the planarized surfaces of the at least one contact via structure 80 and a top surface of the dielectric material layer or any remaining underlying dielectric hard mask layer. The dielectric cap layer 44 can include a dielectric material such as silicon nitride, silicon oxynitride, nitrogen-doped organosilicate glass, or a combination thereof. The at least one contact via structure 80 has a lateral dimension that is less than the dimension of the corresponding opening in the photoresist 80 (See FIG. 2). If at least one line trench is formed in the at least one underlying layer (20, 30, 40) instead of the at least one hole in the processing steps of FIGS. 6-8, at least one metal line can be formed in the at least one underlying layer (20, 30, 40) instead of the at least one contact via structure 80.

The reduction in the lateral dimensions of the etch process of the present disclosure is capable of providing a lateral etch bias, i.e., the difference between a lateral dimension in a developed photoresist layer and a corresponding lateral dimension in an underlayer underlying the metallic hard mask layer, of greater than 30 nm for via hole patterns, or greater than 20 nm for line patterns. The etch bias enabled by the etch process of the present disclosure enables reduction in lateral dimensions of features of openings in a patterned photoresist layer by a factor greater than 2.0 when the feature is transferred into the underlayer underlying the metallic hard mask layer, which is not possible by etch chemistries currently known in the art.

Further, currently known etch processes for metallic films employ $CF_4$ and at least one of bromine and chlorine, so that straight sidewall image transfer without reduction of lateral dimensions of a pattern in a developed photoresist layer. Thus, the lateral dimension shrink ratio of currently known etch processes for metallic films is close to 1.0. In contrast, the etch process of the present disclosure provides a significant reduction in the lateral dimensions of openings in a developed photoresist layer by generating an organic etch residue from the photoresist material that flows over surfaces of a metallic layer, thereby providing a lateral dimension shrink ratio of 2.0 or greater.

Figure 10:
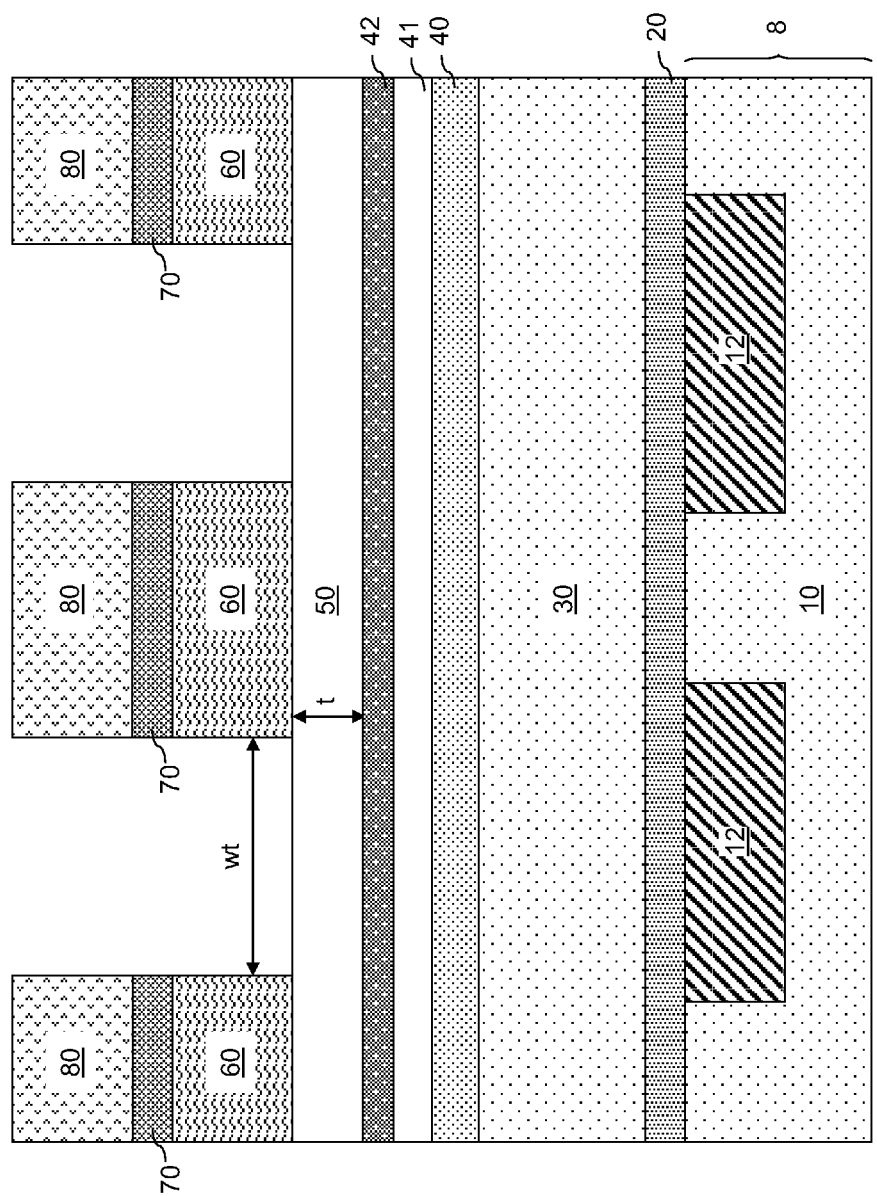
FIG. 10 is a vertical cross-sectional view of a second exemplary structure after patterning of an organic planarizing layer (OPL), an antireflective coating (ARC) layer, and a photoresist layer according to a second embodiment of the present disclosure.

Referring to FIG. 10, a second exemplary structure according to a second embodiment of the present disclosure can be derived from the first exemplary structure by employing a stack of an optional underlying dielectric hard mask layer 40, an optional metallic material layer 41, a dielectric hard mask layer 42, and a metallic hard mask layer 50 instead of a stack of an optional underlying dielectric hard mask layer 40 and a metallic hard mask layer 50 of the first embodiment, and performing the same steps as the processing steps of FIGS. 1, 2, and 3.

The optional metallic material layer 41, if present, includes a metallic material such as an elemental metal, an alloy of at least two elemental metals, a conductive metallic nitride, a conductive metallic carbide, or a combination thereof. The thickness of the optional metallic material layer 41, if present, can be from 3 nm to 60 nm, although lesser and greater thicknesses can also be employed. The dielectric hard mask layer 42 includes a dielectric material such as undoped silicon oxide, doped silicon oxide, silicon nitride, nitrogen-doped organosilicate glass, or a combination thereof. The thickness of the dielectric hard mask layer 42 can be from 3 nm to 60 nm, although lesser and greater thicknesses can also be employed.

Figure 11:
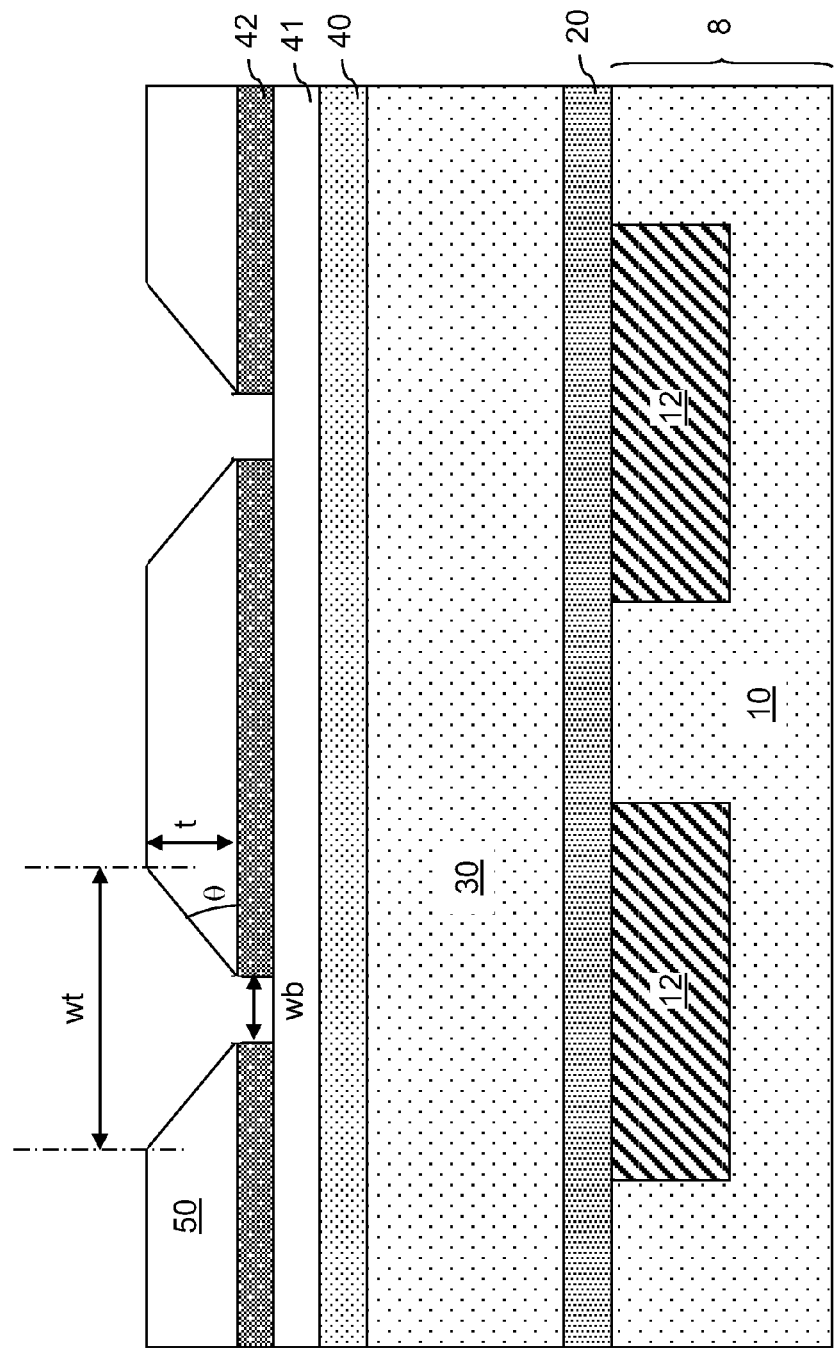
FIG. 11 is a vertical cross-sectional view of the second exemplary structure after an etch of a metallic hard mask layer and a dielectric hard mask layer according to the second embodiment of the present disclosure.

Referring to FIG. 11, the processing steps of FIGS. 4, 5, 6, and 7 of the first embodiment is performed. Thus, the pattern at the bottommost surface of the metallic hard mask layer 50 is transferred into the dielectric hard mask layer 42 employing an etch, which can be an anisotropic etch that etches the material of the dielectric hard mask layer 42 selective to the material of the metallic hard mask layer 50. The metallic hard mask layer 50 is subsequently removed, for example, by a wet etch or a dry etch.

Figure 12:
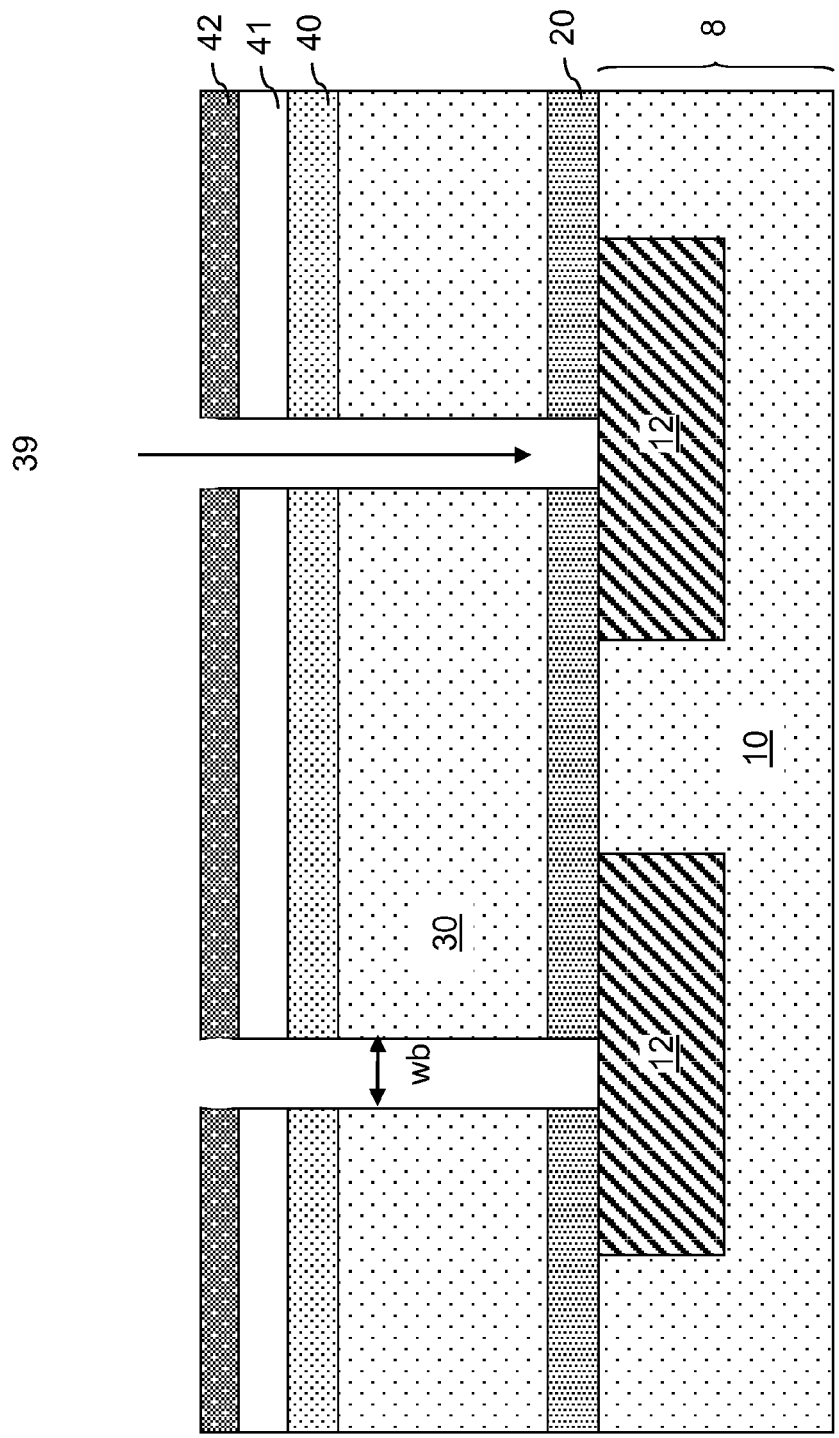
FIG. 12 is a vertical cross-sectional view of the second exemplary structure after transfer of the pattern in the dielectric hard mask layer into underlying layers according to the second embodiment of the present disclosure.

Referring to FIG. 12, the pattern in the dielectric hard mask layer 42 is transferred into underlying layers, which can include, from top to bottom the optional metallic material layer 41, the optional underlying dielectric hard mask layer 40, the dielectric material layer 30, and the optional underlying dielectric cap layer 20. Subsequently, the processing steps of FIG. 9 of the first embodiment can be performed to form a same structure as the structure of FIG. 9.

Figure 13:
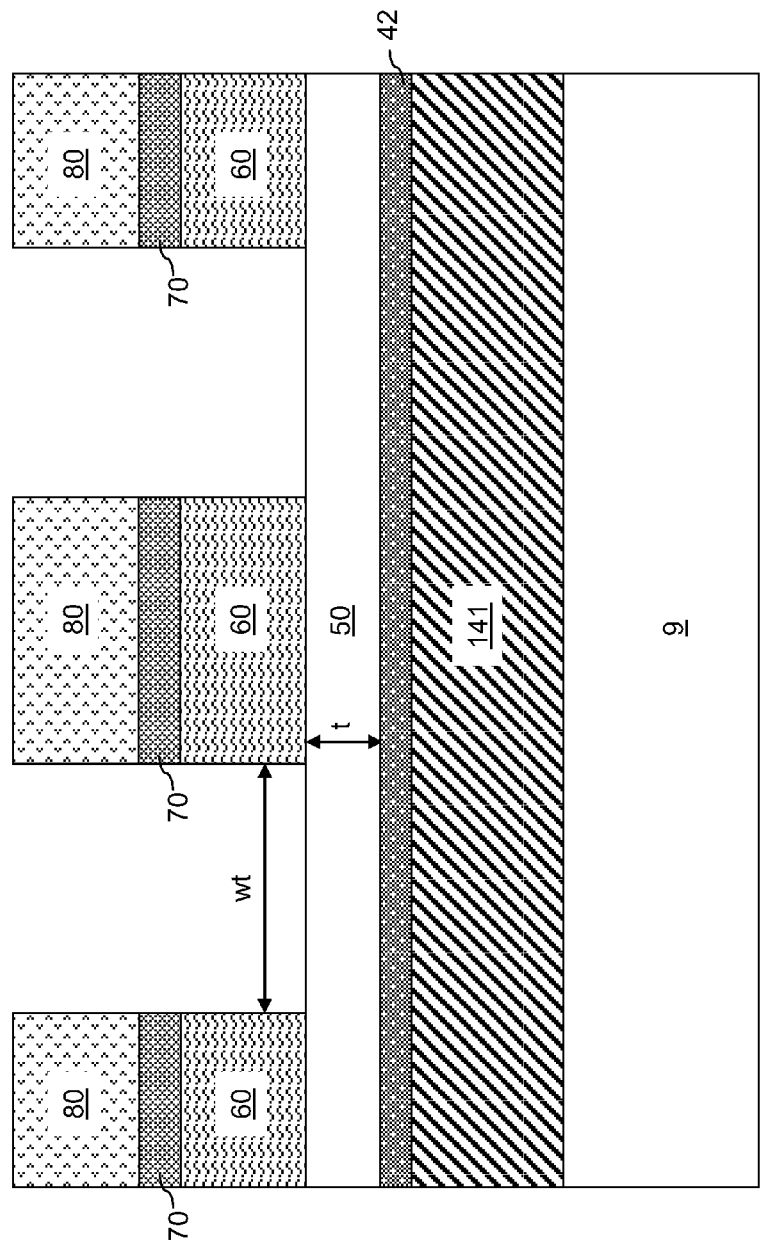
FIG. 13 is a vertical cross-sectional view of a third exemplary structure after patterning of an organic planarizing layer (OPL), an antireflective coating (ARC) layer, and a photoresist layer according to a third embodiment of the present disclosure.

Referring to FIG. 13, a third exemplary structure according to a third embodiment of the present disclosure can be derived from the first exemplary structure by employing a stack of a substrate 9, a metallic material layer 141, and a dielectric hard mask layer 42 instead of a stack of a substrate 8, an optional underlying dielectric cap layer 20, a dielectric material layer 30, and an underlying dielectric hard mask layer 40 of the first embodiment, and performing the same steps as the processing steps of FIGS. 1, 2, and 3.

The substrate 9 can be a semiconductor substrate, a conductive substrate, a dielectric substrate, or a combination thereof. In one embodiment, the substrate 9 can be a transparent substrate such as a glass plate for a lithographic mask. The metallic material layer 141 includes a metallic material such as an elemental metal, an alloy of at least two elemental metals, a conductive metallic nitride, a conductive metallic carbide, or a combination thereof. The thickness of the metallic material layer 141 can be from 3 nm to 1,000 nm, although lesser and greater thicknesses can also be employed. The dielectric hard mask layer 42 includes a dielectric material such as undoped silicon oxide, doped silicon oxide, silicon nitride, nitrogen-doped organosilicate glass, or a combination thereof. The thickness of the dielectric hard mask layer 42 can be from 3 nm to 1,000 nm, although lesser and greater thicknesses can also be employed.

Figure 14:
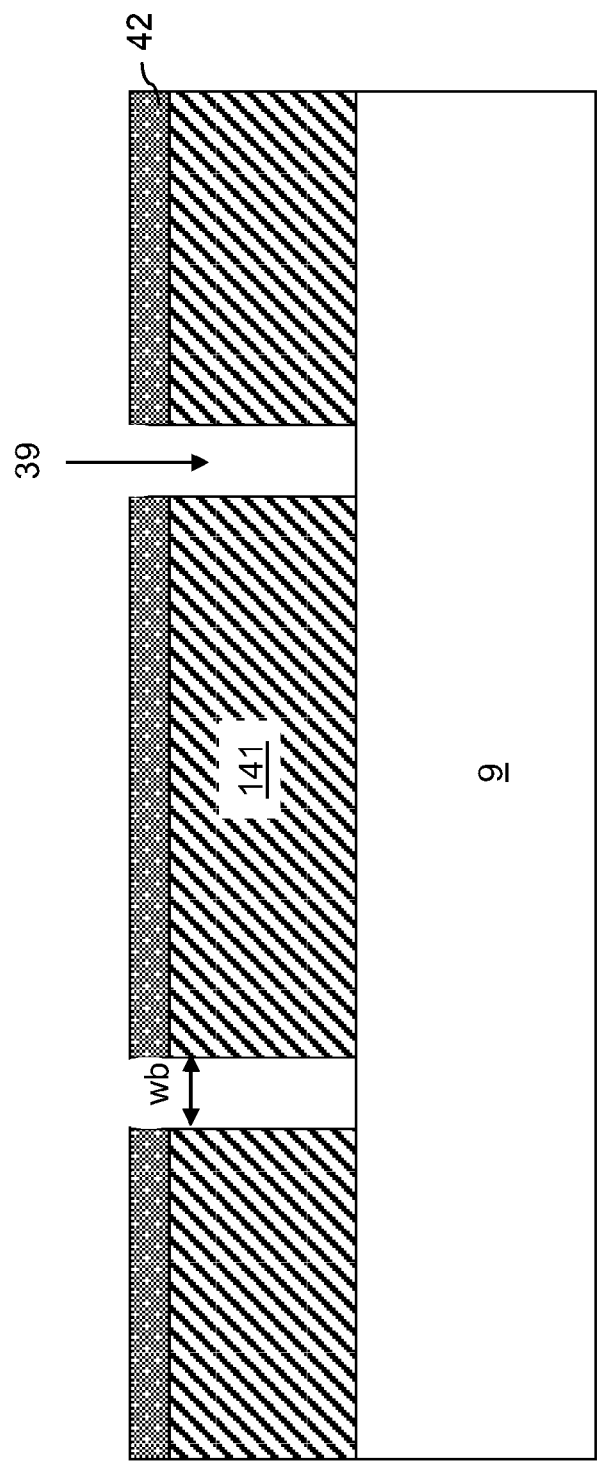
FIG. 14 is a vertical cross-sectional view of the third exemplary structure after an etch of a metallic hard mask layer and a dielectric hard mask layer according to the third embodiment of the present disclosure.

Referring to FIG. 14, the processing steps of FIGS. 4, 5, 6, and 7 of the first embodiment is performed. Thus, the pattern at the bottommost surface of the metallic hard mask layer 50 is transferred into the dielectric hard mask layer 42 employing an etch, which can be an anisotropic etch that etches the material of the dielectric hard mask layer 42 selective to the material of the metallic hard mask layer 50. The metallic hard mask layer 50 is subsequently removed, for example, by a wet etch or a dry etch.

Figure 15:
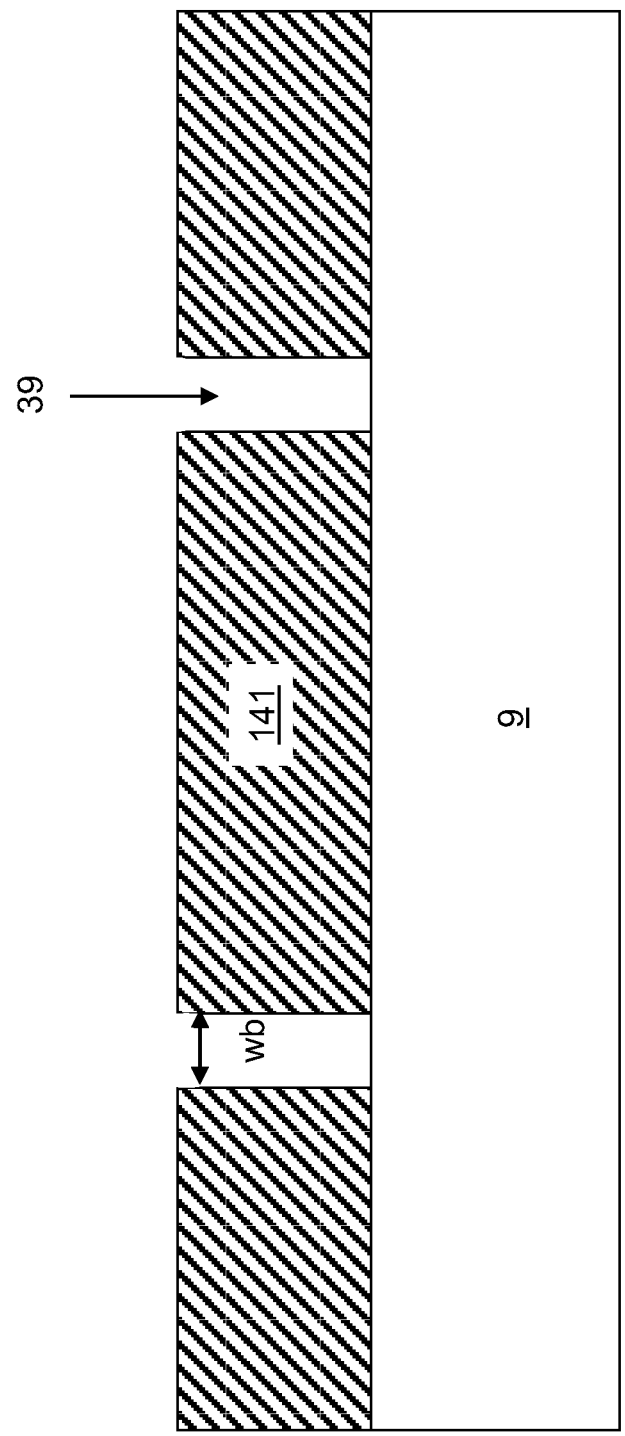
FIG. 15 is a vertical cross-sectional view of the second exemplary structure after transfer of the pattern in an underlying metallic layer according to the third embodiment of the present disclosure.

Referring to FIG. 15, the pattern in the dielectric hard mask layer 42 is transferred into the metallic material layer 141, and optionally through a portion or an entirety of the substrate 9. In one embodiment, the substrate 10 can be a transparent substrate for a lithographic mask and the metallic material layer 141 can include a lithographic pattern for the lithographic mask.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of forming a patterned structure comprising:
   forming a stack comprising, from bottom to top, at least one underlying material layer comprising at least one dielectric material layer and a dielectric hard mask layer, a metallic hard mask layer, and a photoresist layer;
   patterning said photoresist layer with a pattern comprising at least one opening therein;
   transferring said pattern into said metallic hard mask layer in an etch process employing a combination of gases, said combination of gases comprising at least one fluorocarbon gas, oxygen, and at least one inert sputter gas, wherein a top surface of said metallic hard mask layer underneath said at least one opening is etched with a taper, and an angle of said taper relative a horizontal surface is less than 45 degrees;
   transferring a pattern at a bottom surface of said metallic hard mask layer into said dielectric hard mask layer; and
   etching said at least one dielectric material layer employing said at least one dielectric hard mask layer as an etch mask layer.

2. The method of claim 1, wherein said metallic hard mask layer comprises a metal nitride, and said metal nitride is converted into a metal oxide material by oxygen prior to removal from said metallic hard mask layer during said etch process.

3. The method of claim 1, wherein said combination of gases does not include chlorine, bromine, or any compound thereof.

4. The method of claim 1, wherein a ratio of a flow rate of oxygen to a flow rate of said at least one fluorocarbon gas is not greater than 0.2 during said etch process.

5. The method of claim 1, wherein a ratio of a flow rate of said at least one inert sputter gas to a flow rate of said at least one fluorocarbon gas is from 0.25 to 10.

6. The method of claim 1, wherein said at least one inert sputter gas is selected from $N_2$, He, Ne, Ar, Xe, and Kr.

7. The method of claim 1, wherein said angle of said taper is from 15 degrees to 40 degrees.

8. The method of claim 1, wherein a ratio of a first lateral dimension of an opening in said metallic hard mask layer as measured at a height of a topmost surface of said metallic hard mask layer to a second lateral dimension of said opening in said metallic hard mask layer as measured at a bottom surface of said metallic hard mask layer and directly underneath a location of measurement of said first lateral dimension is greater than 2.0.

9. The method of claim 8, wherein said ratio is not less than 3.0, and is not greater than 5.0.

10. The method of claim 8, wherein said first lateral dimension is substantially the same as a width of an opening in said photoresist layer, and said second lateral dimension is less than ½ of a minimum printable dimension for any opening for deep ultraviolet lithography tools.

11. The method of claim 1, wherein said metallic hard mask layer comprises a metallic nitride selected from TiN, TaN, WN, a combination thereof, and a stack thereof.

12. The method of claim 1, wherein said at least one dielectric material layer comprises at least one dielectric material selected from undoped silicon oxide, doped silicon oxide, silicon nitride, silicon oxynitride, non-porous organosilicate glass (OSG), and porous OSG.

13. The method of claim 1, wherein said etch process generates an organic polymer derived from a material of said photoresist layer and flows downward along said top surface of said metallic hard mask layer with said taper.

14. The method of claim 1, wherein said etch process is a plasma etch process in which reactive ions of said combination of gases are generated.

15. The method of claim 1, wherein each hole formed in said dielectric hard mask layer has a horizontal cross-sectional area that is independent of height between a topmost surface of said dielectric hard mask layer and a bottommost surface of said dielectric hard mask layer.

16. A method of forming a patterned structure comprising:
   forming a stack comprising, from bottom to top, at least one underlying material layer, a metallic hard mask layer, and a photoresist layer;
   patterning said photoresist layer with a pattern comprising at least one opening therein;
   transferring said pattern into said metallic hard mask layer in an etch process employing a combination of gases, said combination of gases comprising at least one fluorocarbon gas, oxygen, and at least one inert sputter gas, wherein during said etch process said at least one fluorocarbon gas etches a metallic oxide portion formed by oxidizing a metal in a portion of said metallic hard mask layer exposed in said at least one opening such that a top surface of said metallic hard mask layer underneath said at least one opening is etched with a taper, and an angle of said taper relative a horizontal surface is less than 45 degrees.

17. The method of claim 16, wherein a ratio of a first lateral dimension of an opening that is formed by said etch process in said metallic hard mask layer as measured at a height of a topmost surface of said metallic hard mask layer to a second lateral dimension of said opening in said metallic hard mask layer as measured at a bottom surface of said metallic hard mask layer and directly underneath a location of measurement of said first lateral dimension is greater than 2.0.

18. The method of claim 17, wherein said first lateral dimension is substantially the same as a width of an opening in said photoresist layer, and said second lateral dimension is less than ½ of a minimum printable dimension for any opening for deep ultraviolet lithography tools.

19. The method of claim 16, wherein said at least one underlying material layer comprises a dielectric hard mask layer contacting a bottom surface of said metallic hard mask layer and at least one dielectric material layer located underneath said dielectric hard mask layer, and said method further comprises:
   transferring a pattern at a bottom surface of said metallic hard mask layer into said dielectric hard mask layer; and
   etching said at least one dielectric material layer employing said dielectric hard mask layer as an etch mask layer.

20. The method of claim 19, wherein each hole formed in said dielectric hard mask layer has a horizontal cross-sectional area that is independent of height between a topmost surface of said dielectric hard mask layer and a bottommost surface of said dielectric hard mask layer.

\* \* \* \* \*